United States Patent [19]

Mueller

[11] 4,423,401

[45] Dec. 27, 1983

[54] THIN-FILM ELECTROTHERMAL DEVICE

[75] Inventor: Robert A. Mueller, Portland, Oreg.

[73] Assignee: Tektronix, Inc., Beaverton, Oreg.

[21] Appl. No.: 400,331

[22] Filed: Jul. 21, 1982

[51] Int. Cl.³ .......................................... H01H 61/02
[52] U.S. Cl. .................................... 337/107; 337/109
[58] Field of Search .............. 337/102, 103, 105, 107, 337/109, 111, 112, 113

[56] References Cited

U.S. PATENT DOCUMENTS

| | | | |
|---|---|---|---|
| 3,763,454 | 10/1973 | Zandonatti | 337/404 |
| 4,208,645 | 6/1980 | Harmon et al. | 337/297 |
| 4,272,753 | 6/1981 | Nicolay | 337/297 |

Primary Examiner—George Harris
Attorney, Agent, or Firm—John D. Winkelman

[57] ABSTRACT

Thin film multilayer technology is used to build microminiature electromechanical switches having low resistance metal-to-metal contacts and distinct on-off characteristics. The switches, which are electrothermally actuated, are fabricated on conventional hybrid circuit substrates using processes compatible with those employed to produce thin-film electrical circuits. In a preferred form, such a switch includes a cantilever actuating member comprising a resiliently bendable strip of a hard insulating material (e.g., silicon nitride) to which a metal (e.g., nickel) heating element is bonded. The free end of the cantilever member carries a metal contact, which is moved into (or out of) engagement with an underlying fixed contact by controlled bending of the member via electrical current applied to the heating element.

12 Claims, 8 Drawing Figures

THIN-FILM ELECTROTHERMAL DEVICE

BACKGROUND OF THE INVENTION

1. Field of the Invention

The present invention relates generally to thin-film electrical circuit structures and to methods for making such structures. More particularly, the invention is concerned with the provision of thin-film electrothermal switches and other electrothermally-actuated micromechanical devices.

2. Description of the Prior Art

Thin film deposition and patterning have been used for many years to fabricate hybrid electronic circuits and the passive electrical components (resistors, capacitors, inductors) included in such circuits. Certain active devices (e.g., field-effect transistors) also have been made using thin-film technology. However, circuit switching functions at present must be implemented using either conventional mechanical or electromechanical devices, or solid state switches. The former are normally much too large to be mounted on a thin-film circuit substrate, require long leads for connection to other circuit elements (a serious disadvantage in high frequency applications), and are relatively expensive in comparison to thin-film circuit components. The latter lack the characteristically high off-state to on-state impedance ratio of mechanical switches, and, for many applications, have undesirably high values of on-state "contact" resistance and off-state coupling capacitance.

In a variety of present-day and projected thin-film circuit applications, a need exists for low cost, microminiature switching devices that can be fabricated on conventional hybrid circuit substrates using thin-film deposition and patterning procedures compatible with those used to form the conductive paths, contact pads and passive circuit elements included in such circuits.

U.S. Pat. No. 3,763,454, issued Oct. 2, 1973 to Raymond A. Zandonatti and assigned to the assignee of the present invention, describes a thermally actuated safety switch for a hybrid solid state circuit. The switch includes a curved leaf spring that bridges a pair of conductive runs on the circuit substrate. The spring is welded to one run and joined, under tension, to the other run with a low melting point solder. If the current through an adjacent resistor exceeds a predetermined safe level, the heat it generates will melt the solder and release the spring, opening the circuit. Although the Zandonatti switch is useful for thick-film hybrid circuit applications, the nature of its construction makes it unsuitable for use in thin-film circuits or in other, general purpose applications.

A paper by K. E. Petersen, "Micromechanical Membrane Switches on Silicon", IBM J. Res. Develop., Vol. 23, No. 4, July 1979, describes the structure and operation of several micromechanical switching devices fabricated using conventional photolithographic and integrated circuit processing techniques. The disclosed structures are cantilever beams composed of thin (0.35-μm) metal-coated insulating membranes attached to a silicon substrate at one end. The beams are suspended over shallow rectangular pits produced by anisotropic etching of the substrate. Actuation is achieved by applying a d.c. voltage between the metal coating on the membrane and a highly doped silicon layer at the bottom of the pit. This produces an electrostatic force on the cantilever beam, causing it to bend downward and bring a plated metal projection at its free end into contact with an underlying fixed electrode.

The micromechanical switches disclosed by Petersen are extremely small, but are not well suited for integration into thin-film hybrid circuits. In addition, relatively high voltage (60–70 V.) switching signals are required to actuate the devices, making them incompatible with low voltage, current-driven semiconductor circuitry.

SUMMARY OF THE INVENTION

The present invention is broadly directed to the fabrication of electrothermally-actuated micromechanical devices using procedures compatible with those commonly employed to make thin-film hybrid circuits. A thin-film electrothermal device provided in accordance with the invention suitably may include a substrate having an insulative support surface, a first conductive body bonded to the surface at a first location, a resiliently bendable strip of insulating material overlying the surface and bonded to it at a second location, the strip being spaced from the surface over a portion of the strip's length. A second conductive body secured to the strip and supported by it for movement toward and away from the substrate surface, and an electrical resistance element bonded to the strip to produce controlled bending of the strip when electrical current is passed through the element.

According to a preferred embodiment of the invention, an electrothermally-actuated microswitch having metal contacts and a cantilever-type actuator is provided by steps that include (1) forming a first metal contact and associated conductive pathways on a hybrid circuit substrate, (2) forming a temporary, removable first patterned layer over a defined area of the substrate that includes the first contact, (3) forming a second metal contact on the temporary layer overlying the first contact, (4) forming a second patterned layer of an insulating material on portions of the substrate, removable first layer and second contact, the second layer having an elongate, strip-like configuration with one end overlying and bonded to the substrate, and the opposite end overlying and bonded to the second contact, (5) forming a resistive heating element on the strip-like second layer, and (6) removing the temporary layer.

A more complete understanding of the present invention and its various features, advantages and objectives may be had by referring to the following detailed description and the accompanying drawings.

BRIEF DESCRIPTION OF THE DRAWINGS

FIG. 8 is a side view, partly in section, of an alternative embodiment of the invention.

DETAILED DESCRIPTION

Figure 1:
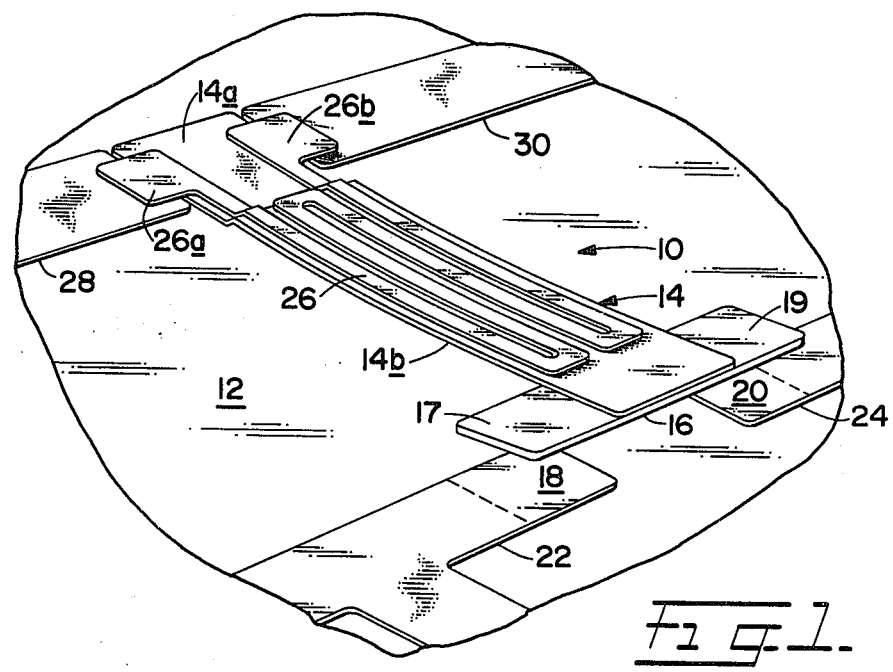
FIG. 1 is a perspective view of a thin-film electrothermal microswitch exemplifying a preferred embodiment of the invention.

Referring first to FIG. 1, an electrothermally-actuated micromechanical switch exemplifying the present inention is indicated generally by reference numeral 10. Switch 10 is formed on the upper surface 12 of an insulating substrate of the type commonly used for thin-film hybrid circuits. The substrate may, for example, be a flat plate of a ceramic material such as high density alumina (Al$_2$O$_3$) or beryllia (BeO), or a glassy material such as fused silica. Disposed overlying the substrate surface is a thin cantilever strip 14 of a firm dielectric material, preferably inorganic. Silicon nitride (Si$_3$N$_4$) has proved to be particularly suitable. Strip 14 includes a fixed end portion, or foot, 14a bonded securely to the substrate, and an offset, body portion 14b spaced from surface 12. An elongate plate 16 of a low resistance metal, suitably gold, is joined to strip 14 adjoining its free end, and extends laterally outward from the sides of the strip to provide a pair of electrical contacts 17 and 19. A corresponding pair of fixed, low resistance metal contacts 18 and 20 is bonded to the substrate surface directly beneath contacts 17 and 19. The fixed contacts suitably are provided by end portions of metallized circuit paths, or runs, 22 and 24 on surface 12.

Bonded to the upper surface of strip 14 is a heating element 26, herein a narrow metal ribbon deposited in a serpentine pattern as shown. Integral tabs 26a and 26b at the foot of the strip connect the heating element to adjacent metal runs 28 and 30, through which electrical current is supplied to element 26. The heating element is formed of a material having a thermal expansion coefficient greater, and preferably substantially greater, than the material forming strip 14. Heating elemnts of electrodeposited nickel have been used with excellent results.

Figure 2:
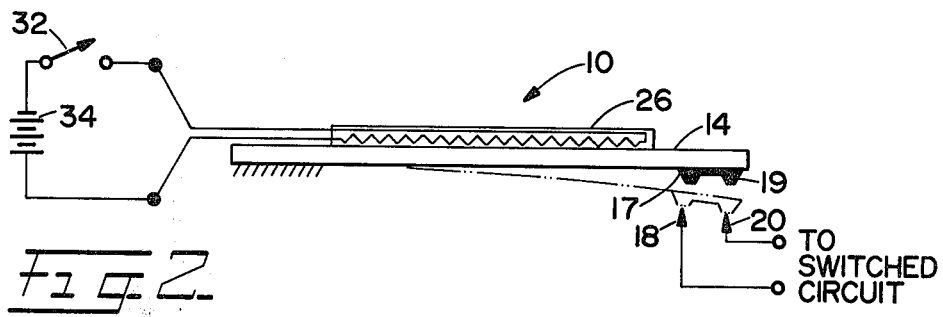
FIG. 2 is a simplified schematic representation of the FIG. 1 microswitch and associated operating circuitry.
Figure 3:
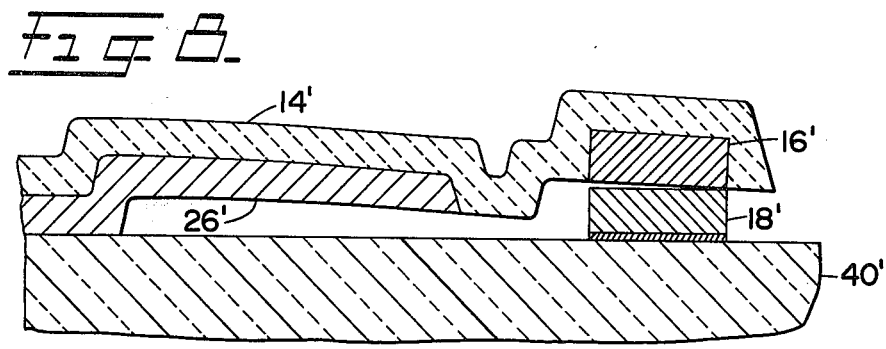
FIGS. 3–7 are cross-sectional views on an enlarged scale illustrating successive stages in the fabrication of the FIG. 1 switch.
Figure 3:
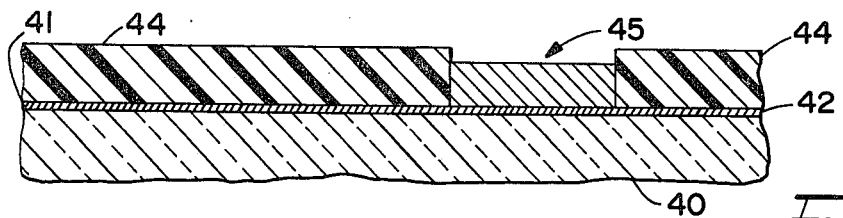

As shown in FIG. 2, switch 10 is a normally-open, double contact design that interconnects fixed contacts 18 and 20 electrically when it is actuated by the application of electrical current to heating element 26. Thus, when switch 32 is closed, current from source 34 (schematically illustrated as a battery in FIG. 2) passes through the metal element, heating and expending it. The difference between the expansion rates of element 26 and dielectric strip 14 produces a downward deflection, or bending, of the cantilever member (as indicated in phantom outline) and brings the opposed contacts together. The electrical connection between fixed contacts 18 and 20 is broken by opening switch 32 to cut off current flow through element 26. As the heating element cools and contracts, the cantilever "unbends" and moves contacts 17 and 19 upward, away from the fixed contacts.

Referring now to FIGS. 3-7 the manufacture of electrothermal thin-film microswitches according to the present invention suitably begins with the deposition of a thin Ti/Pd/Au base layer 42 on upper surface 41 of a supporting substrate 40, which may be a flat plate of ceramic or glass. Layer 42 is formed by mounting substrate 40 in a commercial vacuum system and sequentially depositing films of titanium, palladium and gold on surface 41 by electron-beam evaporation. The titanium deposit serves to adhere the base layer securely to the substrate, while the palladium prevents the subsequent gold film from alloying with the titanium. Suitable thicknesses, in angstroms, for the three components of layer 42 are Ti:400±50, Pd:800±50 and Au:2000±100.

After forming the Ti/Pd/Au base layer, additional gold is deposited selectively at locations for the switch's fixed contacts (contacts 18 and 20 of switch 10) and metal runs (runs 22, 24, 28 and 30). To do this, a layer 44 of photoresist is applied to the metallized substrate and processed to form openings 45 at the desired locations. Gold is then deposited within the openings by electroplating to a thickness of about two to four micrometers, after which the resist is removed and the unplated field areas are etched away. Separate etchants are used for each component of layer 42—a commercial stripper, such as Technic, Inc. "Technistrip", for the gold, a potassium iodide-iodine solution (400 gm KI + 100 gm I$_2$ per liter.) for the palladium, and a 1:1 mixture of 28% NH$_4$OH and 30% H$_2$O$_2$ for the titanium.

Figure 4:
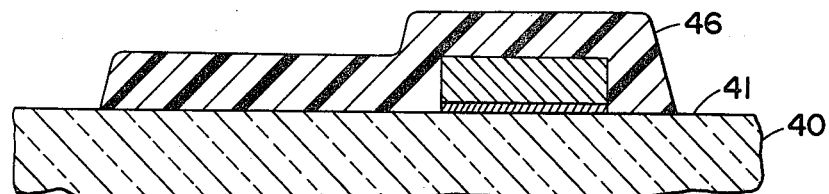
Figure 5:
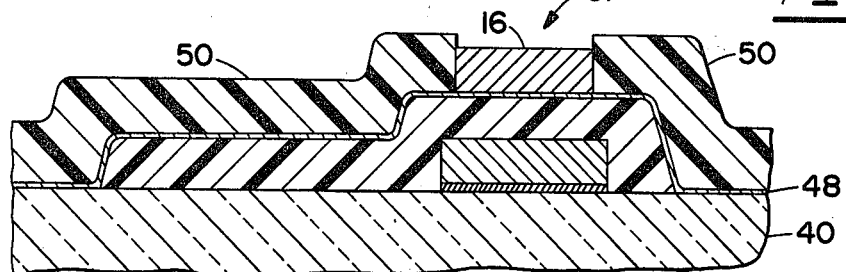

Next, an approximately 2–3 micrometer-thick coating of a selectively removable material is applied to the metal pattern-bearing surface of the substrate, then appropriately masked and etched to form a temporary spacer 46 (FIG. 4) overlying the region where the cantilevered body portion (14b) and movable contact plate (16) of the microswitch will be formed. Suitable removable materials include metals, such as copper, for which selective etchants are available. Polymeric materials, polyimides in particular are presently preferred, however. A polyimide coating may be applied by spinning or spraying a solvent-based solution of a polyimide resin (e.g. Ciba-Geigy XU218HP dissolved in acetophenone) or of a polyimide precursor, such as DuPont "PyreM.L."—a solution of a polymeric acid in N-methyl-2-pyrrolidone. If a precursor is used, it must of course be converted to the corresponding polyimide by heating or treatment with a chemical cyclizing agent. After making the portion of the polyimide coating that is to form spacer 46, the remainder is removed by plasma etching. FIG. 4 shows the result after the photoresist mask is stripped from the temporary spacer.

Movable contacts for the switch next are formed on spacer 46 overlying the previously-formed fixed contacts. A film 48 of gold about 1000 to 2000 angstroms thick is evaporated onto the spacer and surrounding areas of the substrate, and coated with a layer 50 of photoresist. The photoresist layer is then exposed and developed to provide an opening 51 of the desired configuration—i.e., that of contact plate 16—above the fixed contacts. Additional gold is then electrodeposited on the gold film within opening 51 to a total thickness of about 2 micrometers, after which layer 50 is stripped away and the underlying field portion of film 48 is removed using a gold etchant.

After forming contact plate 16 on spacer 46, a 2-micrometer thick layer of silicon nitride is applied to the entire upper surface of the substrate by plasma deposition, covering both the temporary spacer and the contact plate. A protective mask of photoresist then is formed on the Si$_3$N$_4$ layer covering the portions that are to constitute the foot and body portions of cantilever strip 4. The remaining, unmasked portions of the silicon nitride layer are eliminated by plasma etching to form the dielectric strip, after which the photoresist mask is removed.

The next step, forming a resistive heating element on the dielectric strip, begins with the deposition of a metallic adhesion layer, suitably a three component layer of TiW/Pd/TiW, over substrate surface 41, spacer 46 and strip 14. Such a layer may be applied to depositing a TiW alloy (10% titanium/90% tungsten) and palladium sequentially by cathode sputtering using a commercially available magnetron-type sputtering system. About 2500 angstroms of TiW alloy is applied initially, followed by about 400 angstroms of palladium and about 200 angstroms of TiW alloy. A photoresist coating is then applied to the adhesion layer and processed to expose a serpentine-shaped area of the metal coating overlying dielectric strip 14 and portions of the conductor runs that are intended to supply current to the heating element. Next, the uppermost deposit of TiW is removed from the unmasked areas of the adhesion layer with 30% $H_2O_2$ to expose the underlying palladium deposit. Nickel is then plated onto the fresh palladium surface to a thickness of about two to four micrometers. The nickel plating should be of a type having a relatively low internal stress, such as nickel electrodeposited from a sulfamate bath.

Figure 6:
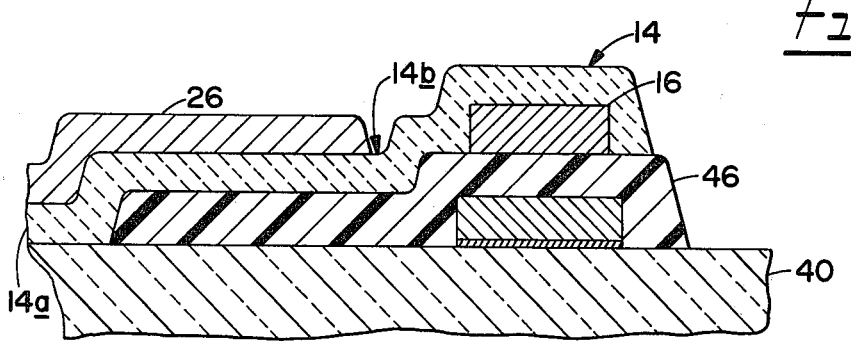

Fabrication of the micromechanical switch is completed by stripping the photoresist mask from the adhesion layer and etching away the unplated areas of the layer using 30% $H_2O_2$ to remove the TiW deposits and a potassium iodide-iodine solution to dissolve the palladium. The structure at this stage is shown in FIG. 6. Finally, temporary spacer 46 is removed with a suitable etchant. For the preferred polyimide material, a commercial photoresist stripper such as Allied Chemical A-20 or a polyimide stripper such as Shipley M-150 may be used. After the chemical strip, any remaining traces of the polymer material are removed using a brief oxygen plasma exposure.

Figure 7:
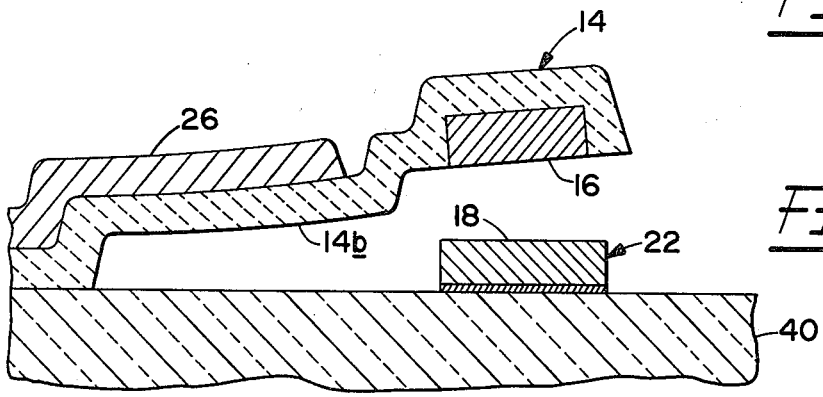

The completed microswitch structure is shown in FIG. 7. The cantilever element formed by strip 14 and heating element 26 typically curves upward from the substrate surface somewhat, as shown in the figure. The curvature is thought to result either from residual compressive stress in the plated nickel deposit forming the heater element, or thermal contraction of the heater element after its deposition at an elevated temperature (about 60° C. in the case of the exemplified sulfamate bath), or both.

Thin-film electrothermal switches of the FIG. 1 configuration with silicon nitride cantilever strips about 120 micrometers wide and from about 400 to about 600 micrometers long having been fabricated using the above-described procedure. Such switches require very little power to operate—typically about 100 mW. and as little as 50 mW. to close the contacts. Contact resistance values for the closed switches are typically about 200 milliohms and as low as about 150 milliohms, making them suitable for low level signal switching. In addition, the switches exhibit unexpectedly fast switching rates—up to 30 Hz. cycling between fully open and fully closed positions when the heating element is driven by a 200 mA. current pulse. The switches of the invention may be fabricated using thin-film deposition and patterning procedures compatible with those used to form hybrid circuits, allowing direct integration of the switches into such circuits. Moreover, because they are fabricated by thin-film technology, high volume manufacturing is relatively inexpensive on a per unit basis. Five hundred such switches can be formed on a 2×2 inch substrate, for example.

Various alternative switch constructions and contact configurations are, of course, possible. Referring by way of example to FIG. 8, a normally-closed version of the FIG. 1 cantilever-type microswitch may be provided by forming heating element 26' on the underside of cantilever strip 14'. When current is supplied to the heater, it expands more rapidly than the dielectric strip, bending the member upward to open the switch.

Because the degree of contact movement can be controlled by the amount of current applied to the heating element, the electrothermal device of the invention also has utility in non-switching applications. For example, the position and movement of the plate at the free end of the cantilever can be precisely controlled by monitoring the capacitance between the plate and an underlying fixed metal contact and varying the input current to the heating element accordingly.

It will be apparent to those skilled in the relevant art that various other changes and modifications may be made in the structural embodiments and fabrication process described above. The full scope of the invention is defined only by the terms of the appended claims, and is not limited to the particular examples described herein.

I claim as my invention:

1. A thin-film electrothermal device, comprising
   a substrate having an insulative support surface,
   a first conductive body bonded to said surface,
   a resiliently bendable strip of dielectric material overlying said surface and spaced therefrom over a portion of its length,
   a second conductive body secured to said strip and supported thereby for movement toward and away from said first body by bending of said strip toward and away from said surface, and
   an electrical resistance element bonded to said strip to effect controlled bending of the strip toward and away from said surface in response to the flow of electrical current through said element.

2. The thin-film device of claim 1, wherein said second conductive body is secured to said strip adjacent one end thereof, and the opposite end of the strip is secured to said support surface.

3. The thin-film device of claim 2, wherein said first conductive body is bonded to the support surface at a location underlying said second conductive body.

4. The thin-film device of claim 3, wherein said first and second conductive bodies comprise switch contacts, that are closed and opened by bending of said strip toward and away from the surface.

5. The thin-film device of claim 4, wherein said contacts are normally open, and are closed by passing current through said resistance element.

6. The thin-film device of claim 4, wherein said contacts are normally closed, and are opened by passing current through said resistance element.

7. A thin-film electrothermal microswitch, comprising
   a substrate having an insulative support surface,
   a first switch contact bonded to said surface at a first location thereon,
   a resiliently bendable strip of insulating material overlying said surface and spaced therefrom over a portion the strip's length, said strip being bonded to said surface at a second location thereon,
   a second switch contact secured to said strip and supported thereby for movement toward and away from said first contact by bending of said strip toward and away from said surface,
   an electrical resistance element bonded to said strip, and
   means for connecting said element to an electrical current source,
   said switch being actuated by the controlled flow of electrical current through said resistance element.

8. The electrothermal microswitch of claim 7, wherein said second contact is secured to said strip adjacent one end thereof, and the opposite end of the strip is secured to said surface.

9. The electrothermal microswitch of claim 7, wherein said contacts are normally open, and are closed by passing current through said resistance element.

10. The electrothermal microswitch of claim 7, wherein said contacts are normally closed, and are opened by passing current through said resistance element.

11. The electrothermal microswitch of claim 7, wherein said strip is formed of silicon nitride.

12. The electrothermal microswitch of claim 7, wherein said resistance element is formed of nickel.

* * * * *